United States Patent
Sunkavalli et al.

(10) Patent No.: US 8,982,602 B2
(45) Date of Patent: Mar. 17, 2015

(54) MEMORY DEVICES, CIRCUITS AND, METHODS THAT APPLY DIFFERENT ELECTRICAL CONDITIONS IN ACCESS OPERATIONS

(75) Inventors: Ravi Sunkavalli, Cupertino, CA (US); Malcolm Wing, Palo Alto, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/600,144

(22) Filed: Aug. 30, 2012

(65) Prior Publication Data

US 2014/0063901 A1     Mar. 6, 2014

(51) Int. Cl.

| G11C 13/00 | (2006.01) |
|---|---|
| G11C 7/00 | (2006.01) |
| G11C 7/10 | (2006.01) |
| G11C 7/12 | (2006.01) |
| G11C 7/22 | (2006.01) |
| G11C 11/419 | (2006.01) |
| G11C 11/56 | (2006.01) |
| G11C 7/08 | (2006.01) |
| G11C 11/16 | (2006.01) |
| G11C 16/26 | (2006.01) |

(52) U.S. Cl.
CPC ........ *G11C 13/0069* (2013.01); *G11C 11/5642* (2013.01); *G11C 11/419* (2013.01); *G11C 7/00* (2013.01); *G11C 7/08* (2013.01); *G11C 11/1673* (2013.01); *G11C 13/004* (2013.01); *G11C 16/26* (2013.01); *G11C 13/0002* (2013.01)
USPC ...... 365/148; 365/189.15; 365/163; 365/158; 365/189.011

(58) Field of Classification Search
CPC ...... G11C 7/00; G11C 11/419; G11C 13/004; G11C 16/26; G11C 7/08; G11C 11/5642; G11C 11/1673; G11C 13/0069; G11C 13/0002
USPC ................. 365/148, 158, 163, 171, 172, 173, 365/189.15
See application file for complete search history.

(56) References Cited

U.S. PATENT DOCUMENTS

| 2007/0217253 A1* | 9/2007 | Kim et al. ..................... 365/163 |
| 2009/0049364 A1* | 2/2009 | Jo et al. ......................... 714/763 |
| 2009/0303785 A1* | 12/2009 | Hwang et al. ................. 365/163 |
| 2010/0235714 A1* | 9/2010 | Toda ............................. 714/763 |
| 2012/0287720 A1* | 11/2012 | Choi ........................ 365/185.19 |

* cited by examiner

*Primary Examiner* — Ly D Pham

(57) ABSTRACT

A memory device can include a plurality of memory elements programmable between different impedance states; and circuits configured to apply first electrical conditions to one group of memory elements and second electrical conditions, different from the first electrical conditions, to another group of memory elements to vary a speed of an access operation to the different groups of memory elements.

22 Claims, 9 Drawing Sheets

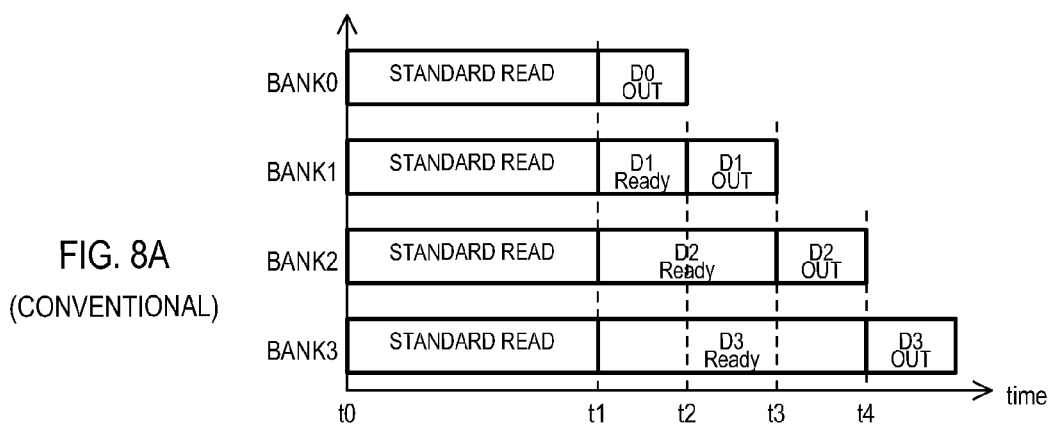
FIG. 8A
(CONVENTIONAL)

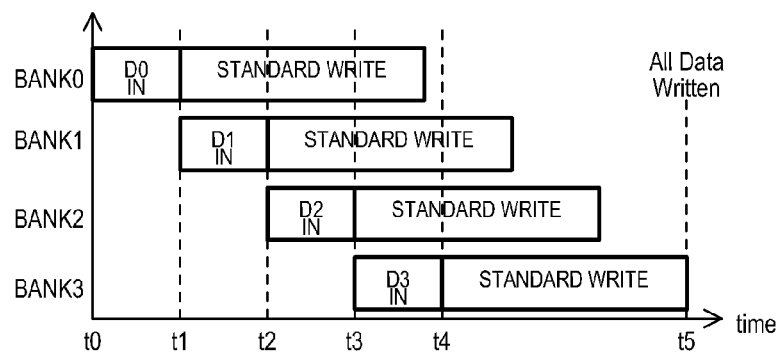
FIG. 10A
(CONVENTIONAL)

MEMORY DEVICES, CIRCUITS AND, METHODS THAT APPLY DIFFERENT ELECTRICAL CONDITIONS IN ACCESS OPERATIONS

TECHNICAL FIELD

The present disclosure relates generally to memory devices, and more particularly to memory devices having elements programmable between two or more impedance states.

BACKGROUND

Programmable impedance elements can include, but are not limited to: conductive bridging random access memory (CBRAM) type elements, magneto-resistive RAM (MRAM) type elements, and phase change memory (PCM) type elements. Such elements are typically programmed by applying electrical conditions to vary their resistance, current or voltage response.

Conventionally, the speed at which elements can be read can be limited by the need to prevent disturbance of the element's state. For example, while increasing the read voltage applied to a CBRAM element can increase the speed at which data is read, if such a read voltage is too high, the CBRAM element can be unintentionally programmed (changing the stored data value in the event the element was in an erased state). That is, too high a read voltage can result in a destructive read.

Similarly, a speed at which data can be written into an element can be limited. While a large programming voltage can change an element's resistance rapidly, an ending resistance may vary significantly between elements. This can make it difficult to arrive at a desired common end resistance value, without some additional programming steps.

BRIEF DESCRIPTION OF THE DRAWINGS

FIGS. 8A to 8F are timing diagrams showing read operations for a device like that of FIGS. 7A and 7B.

FIGS. 10A to 10C are timing diagrams showing read operations for a device like that of FIG. 9.

DETAILED DESCRIPTION

Figure 1:
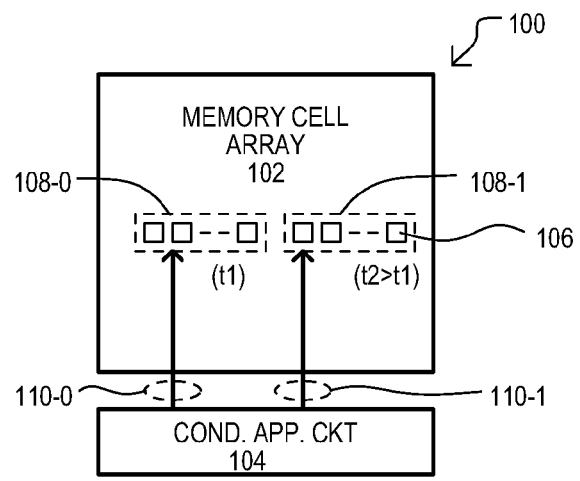
FIG. 1 is a block schematic diagram of a memory device according to an embodiment.

Embodiments disclosed herein show devices and methods directed toward memory devices that can include elements programmable between two or more different impedance states. The memory devices can include circuits that can apply different electrical conditions to different groups of memory cells in access operations. The different electrical conditions can result in different access speeds for the different groups of memory cells and/or variations in power consumption between the different groups.

According to embodiments herein, a memory element can be programmed to provide static impedance values (e.g., resistance, capacitance) and/or a dynamic changes in impedance (e.g., different changes in resistance and/or capacitance under the same data sensing conditions).

In the embodiments below, like sections are referred to by the same reference character but with the leading digit(s) corresponding to the figure number.

Referring to FIG. 1, a memory device 100 according to one embodiment is shown in a block schematic diagram. A memory device 100 can include a memory cell array 102 and a condition application circuit 104. A memory cell array 102 can include memory elements (one shown as 106) arranged into groups (two shown as 108-0/1). Memory elements of a same group 108-0/1 can be accessed together in a same operation (e.g., read or write). It is understood that while FIG. 1 shows two groups 108-0/1, an operation may access more than two groups. In addition, while each group 108-0/1 can include as few as one memory element, a group can also include a logical grouping of various multiples of memory elements (i.e., nibble, byte, word, double word, page, etc.).

Within a memory cell array, each memory cell can include one or more memory elements (e.g., 106), and may, or may not, include active devices (e.g., transistors). As but a few examples, a memory cell can consists of one memory element, consist of multiple memory elements, include a one-transistor one-element (1T/1R) type configuration, a 2T/2R type configuration, or have any of a number of static random access memory (SRAM) type configurations, with memory elements serving as load devices (e.g., a 4T SRAM cell).

Further, it is also understood that a memory cell array 102 can include memory elements that are divided into larger groups, such as banks, pages, sectors, etc.

Memory elements can take various forms, but in particular embodiments can include any of: conductive bridging random access memory (CBRAM) type elements, magneto-resistive RAM (MRAM) type elements, and phase change memory (PCM) type elements. In very particular embodiments, memory elements can include a memory layer formed between two electrodes, the memory layer including a chalcogenide, a metal oxide, and/or any other suitable ion conducting material.

A condition application circuit 104 can apply electrical conditions to memory cell groups 108-0/1 in access operations. However, unlike conventional approaches, a condition application circuit 104 can apply different electrical conditions to different groups in the same access operation, to thereby vary an access speed among to various groups and/or a power consumption profile of the device. In particular embodiments, a read and/or a write speed for one or more groups can be faster than the read or write speed for one or more other groups, due to the difference in applied electrical conditions.

It is understood that, while not shown in FIG. 1, embodiments can include various circuits between a condition application circuit 104 and memory cell array 102. As but one example, such intervening circuits can include one or more address decoded paths.

In the very particular embodiment of FIG. 1, first electrical conditions 110-0 can be applied to group 108-0, while second electrical conditions 110-1 can be applied to group 108-1. As a result, group 108-0 can be accessed (read from or written to) in a time t1, while group 108-1 can be accessed in a time t2, where t2>t1.

It is understood that while FIG. 1 shows the application of two different electrical conditions (108-0/1), alternate embodiments can apply more than two different electrical conditions.

In addition, the application of different electrical conditions can be universal (i.e., different electrical conditions can be applied to any of the memory elements), or partitioned (i.e., one portion of memory cell array 102 can only receive a subset of the available different electrical conditions).

Figure 2A:
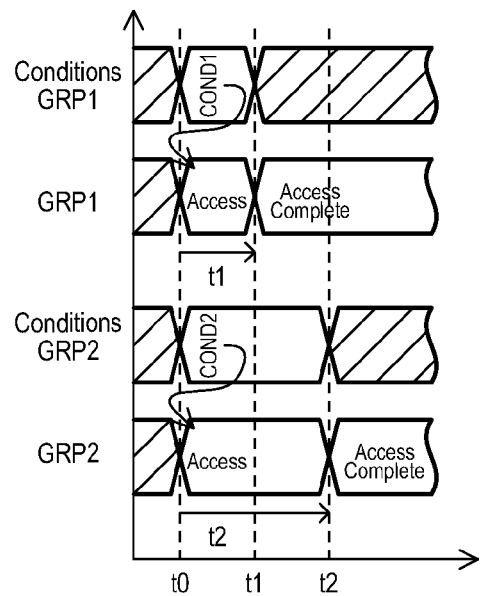
FIGS. 2A and 2B are timing diagrams showing access operations according to embodiments.
Figure 2B:
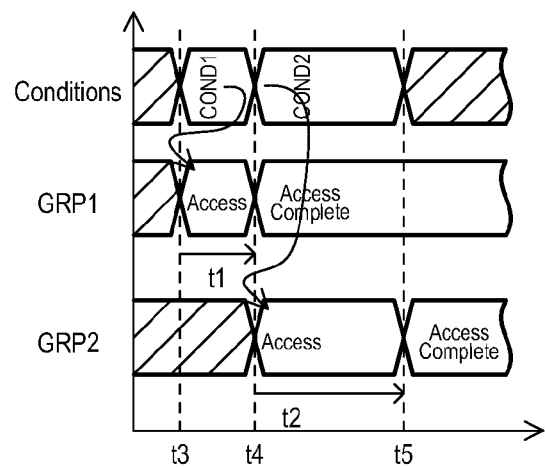

Embodiments can apply different electrical conditions to different groups of memory cells in a same access operation in a parallel and/or in a serial fashion. FIGS. 2A and 2B show accesses according to such embodiments.

FIG. 2A shows a parallel access operation according to an embodiment.

At about time t0, first electrical conditions (COND1) can be applied to a first group (GRP1), and second electrical conditions (COND2) can be applied to a second group (GRP2).

At about time t1, an access operation to the first group (GRP1) can be complete.

At about time t2, which follows time t1, an access operation to the second group (GRP2) can be complete.

Completion of an access operation can include, but is not limited to, a sensing of impedance values stored by a group of memory cells, a latching of read data stored by the group of memory cells, an output of read data from a memory device corresponding to the group of memory cells, and/or a writing of data to the memory cells (where such a writing can include a fast "rough" writing, which can be followed by one or more other follow on operations, to fine tune impedance values). However, in such cases, it is a difference in the applied electrical conditions that allows a difference in access speeds between the memory cell groups.

FIG. 2B shows a serial access operation according to an embodiment.

At about time t3, first electrical conditions (COND1) can be applied to a first group (GRP1).

At about time t4, an access operation to the first group can be complete, and second electrical conditions (COND2) can be applied to another group (GRP2).

At about time t5, an access operation to the second group (GRP2) can be complete.

It is noted that differences in applied electrical conditions can take various forms, according to a type of memory element and desired response. FIGS. 3A to 3D show differences in applied electrical conditions according to particular embodiments.

Figure 3A:
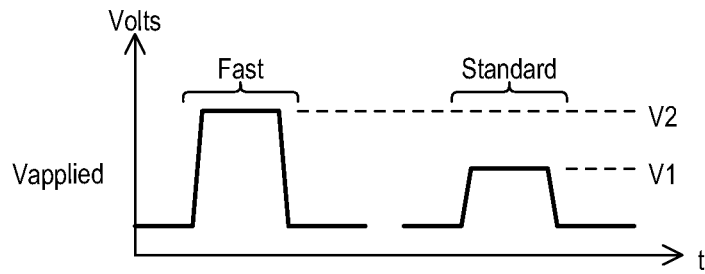
FIGS. 3A to 3D are timing diagrams showing differences in applied electrical conditions according to various embodiments.

FIG. 3A shows electrical conditions that vary according to an applied voltage amplitude. FIG. 3A shows a waveform (Fast) for first electrical conditions and waveform (Standard) for second electrical conditions. Waveform Fast can have a greater amplitude (V2) than that of waveform Standard. In particular embodiments, a greater amplitude (V2) can result in a faster access operation than a smaller amplitude (V1). In one very particular embodiment, memory elements can be CBRAM type elements, and greater amplitude can result in a faster impedance sensing speed and/or a faster programming speed.

It is understood that while FIG. 3A shows Fast and Standard pulses with about the same duration, in alternate embodiments, such pulses can have different durations.

Figure 3B:
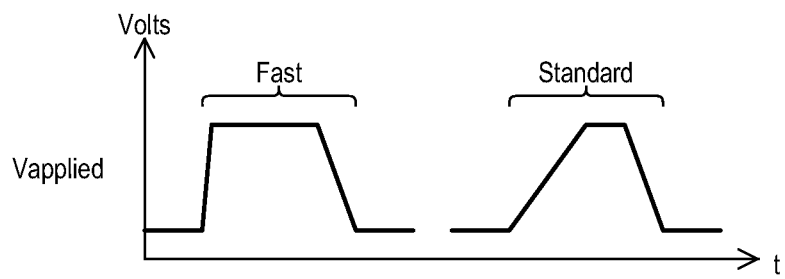

FIG. 3B shows electrical conditions that vary according to waveform shape. Waveform Fast can have one shape, while waveform Standard can have a different shape. In a particular embodiment, a waveform Fast can result in a faster access (e.g., read and/or write) than waveform Standard.

Figure 3C:
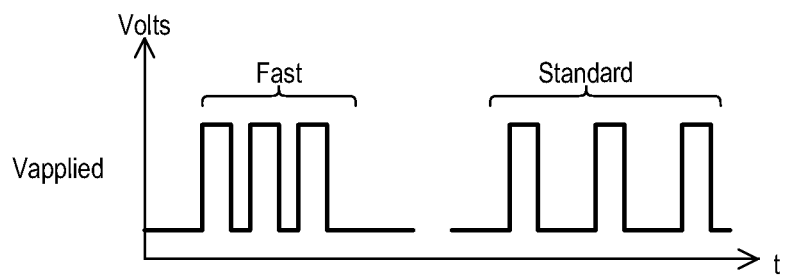

FIG. 3C shows electrical conditions that vary according to pulse density. Waveform Fast can have a greater pulse density than waveform Standard. In a particular embodiment, a waveform Fast can result in a faster access than waveform Standard.

Figure 3D:
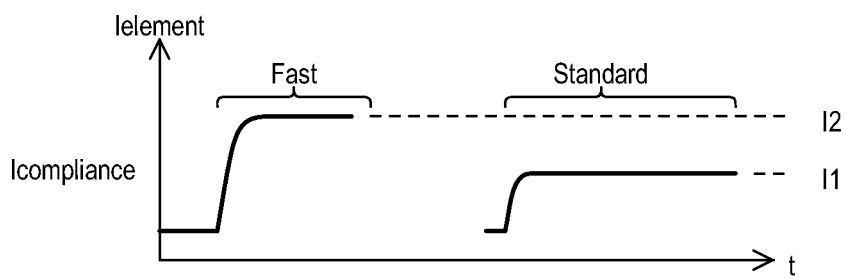

FIG. 3D shows electrical conditions that vary according to a compliance current through an element. Waveform Fast can have a higher compliance current (I2) than a waveform Standard. In a particular embodiment, a waveform Fast can result in a faster access than waveform Standard.

It is understood that the above waveforms represent variation in electrical conditions according to particular embodiments, and should not be construed as limiting. Embodiments can include various other differences in electrical conditions.

It is also noted that waveforms can be repeated numerous times in an operation. That is, access operations can apply a sequence of such pulses in a read or write operation. Further, other embodiments can include combinations of the various approaches shown in FIGS. 3A to 3D.

Figure 4:
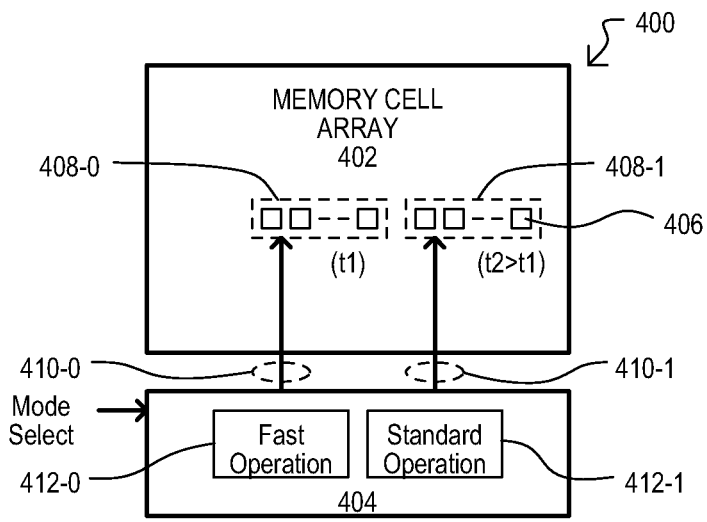
FIG. 4 is a block schematic diagram of a memory device according to another embodiment.

Referring to FIG. 4, a memory device 400 according to another embodiment is shown in a block schematic diagram. In one very particular embodiment, memory device 400 can be one implementation of that shown in FIG. 1.

FIG. 4 shows a memory device 400 having a condition application circuit 404 that can switch between different modes of operation that apply different electrical conditions. In the particular embodiment shown, condition application circuit 404 can receive a mode select value (Mode_Select) that can determine which electrical conditions are output from condition application circuit 104. A fast operation section 412-0 can provide one or more voltages (e.g., V1), while a standard operation section 412-1 can apply a different voltage (V2). The fast/standard operation sections 412-0/1 can be enabled or disabled according to a mode input (Mode Select). Fast and standard operation sections 412-0/1 can be enabled together. In addition or alternatively, one such section can be enabled while the other is disabled.

It is understood that a condition application circuit 400 can apply more than two different conditions, for more than two different access speeds. Thus, while FIG. 4 shows a fast and standard operation sections 412-0/1, other embodiments could provide more than two types of operations (i.e., standard, fast and faster).

Figure 5:
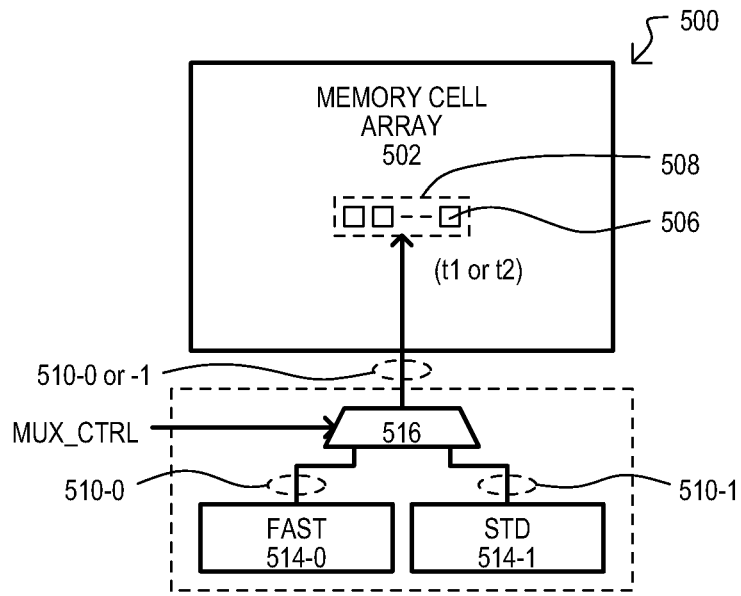
FIG. 5 is a block schematic diagram of a memory device according to a further embodiment.

Referring to FIG. 5, a memory device 500 according to a further embodiment is shown in a block schematic diagram. In one very particular embodiment, memory device 500 can be one implementation of that shown in FIG. 1.

FIG. 5 shows a memory device 500 having a condition application circuit 504 in which different electrical conditions can be applied via a multiplexing circuit. In the particular embodiment shown, a condition application circuit 504 can include a fast condition circuit 514-0, a standard condition circuit 514-1, and a multiplexer (MUX) 516. Each condition circuit 514-0/1 can generate different electrical conditions 510-0/1 for application as inputs to MUX 516. As understood from above, while the embodiment of FIG. 5 shows two condition circuits 514-0/1, alternate embodiments can include multiple such circuits, with a MUX having a correspondingly larger number of inputs.

A MUX 516 can receive a selection value MUX_CTRL, which can select from among multiple electrical conditions, and apply them to a group of elements 508. A selection value MUX_CTRL can be generated according any suitable input, including but not limited to: a static value (i.e., one the does not change during the operation of the memory device) or a dynamic value (i.e., one that changes in response to inputs, such as address values, command inputs, etc.).

It is understood that in some embodiments, a memory device 500 can have multiple condition application circuits, each corresponding to a particular portion of the memory cells (i.e., bank, sector, page). Each condition application circuit can individually select the electrical conditions applied to a group of elements within its portion of the memory cells.

In addition, as in the case of FIG. 4, other embodiments can include more than two condition circuits, to provide more than two access speeds.

In some embodiments, access operation can include read operations in which the application of one set of electrical conditions can sense the impedance states of memory elements faster than other conditions, but such a sensing operation can potentially alter the stored data value. That is, "fast" read conditions can potentially result in "destructive reads". In such embodiments, a memory device can store read data acquired in a fast read operation, and then write such data back into the memory elements, correcting any unwanted data changes caused by the fast read operation. One such particular embodiment is shown in FIGS. 6A and 6B.

Figure 6A:
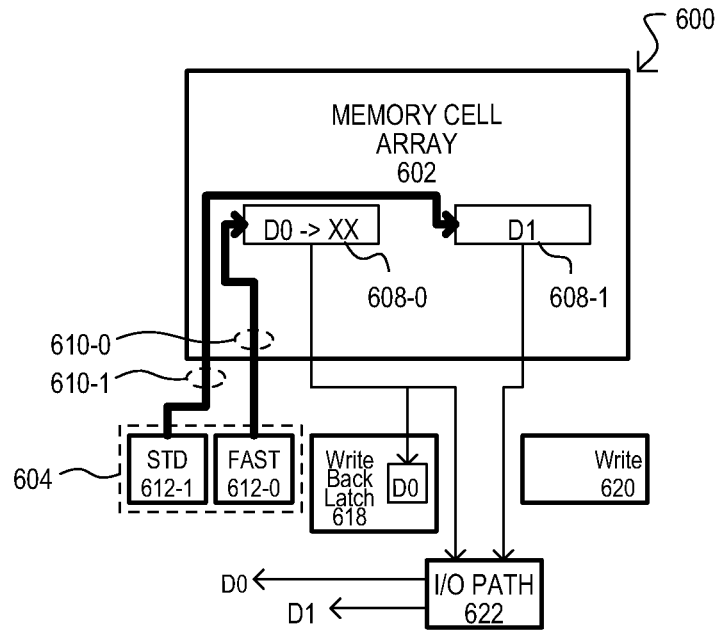
FIGS. 6A and 6B are a sequence of block schematic diagrams showing a memory device with read/write-back operations according to embodiments.
Figure 6B:
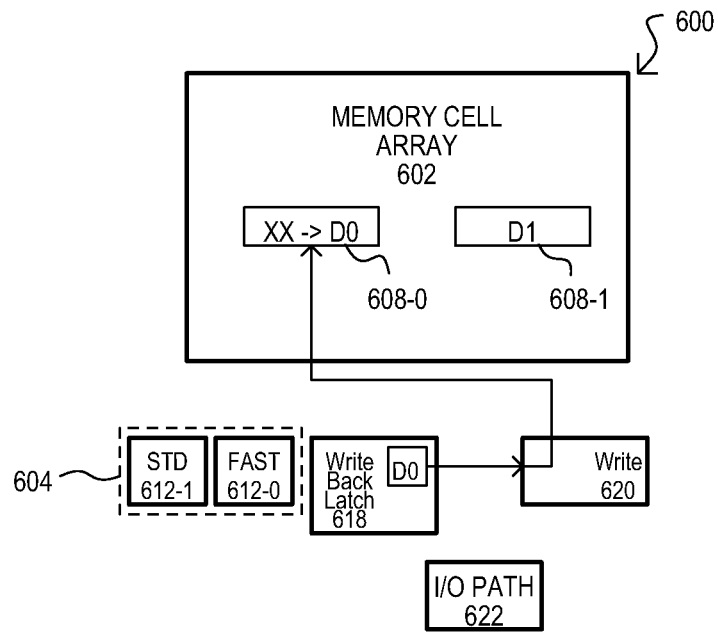

Referring to FIGS. 6A and 6B, a memory device 600 according to another embodiment is shown in a sequence of block schematic diagrams. In one very particular embodiment, memory device 600 can be one implementation of that shown in FIG. 1.

A memory device 600 can have having a write back capability. Read data, provided by a potentially destructive "fast" read operation, can be written back into programmable elements. In the particular embodiment shown, memory device can include a memory cell array 602, a condition application circuit 604, a write back latch 618, a write circuit 620, and an input/output (I/O) path 622.

Condition application circuit 604 can apply two or more different electrical conditions to different groups of elements as described in embodiments herein, or equivalents. In the embodiment shown, it is assumed that condition application circuit 604 can apply "fast" read electrical conditions (hereinafter fast read conditions) 612-0 that can determine states of a group of elements in a shorter time than standard read electrical conditions (hereinafter standard read conditions) 612-1. Further, fast read conditions 612-0 disturb, or have the potential to disturb, the impedance states of elements to which they are applied.

A write back latch 618 can store read data accessed by application of fast read conditions. Such stored read data values are accessible by, or applied to, a write circuit 620.

A write circuit 620 can write data values stored in write back latch 618 back into a group of elements. In particular embodiments, a write circuit 620 can write data back into the same physical group of memory elements from which it was originally read. However, in alternate embodiments, a memory device can have a more sophisticated addressing system, and such data can be written into a new physical group that serves as a logical substitute for the original group.

An I/O path 622 can output read data values sensed from groups of elements by the application of both fast and standard read conditions. In some embodiments an I/O path 622 include bi-directional data paths, while in other embodiments read output data paths can be separate from write data input paths. It is understood that embodiments can include various circuits between an I/O path 622 and memory cell array 102. As but two examples, such intervening circuits can include sense amplifier circuits and/or address decoded paths.

Having described various sections of a memory device 600, a read/write-back operation for the memory device will now be described.

Referring to FIG. 6A, a read portion of a read/write-back operation is shown. Fast read conditions 610-0 can be applied to one group of memory elements 608-0, and standard read conditions 610-1 can be applied to another group of memory elements 608-1. As understood from above, such different read conditions can be applied in parallel to the corresponding groups, or in series.

Application of first read conditions to group 608-0 can result in the sensing of impedance states and the generation of read output data D0. However, as indicated by the notation D0→XX, the fast read conditions can, or have the potential to, alter the data stored within the group 608-0. Read output data D0 can be provided to write back latch 618 as well as I/O path 622. I/O path 622 can output read data D0 from memory device 600.

Application of standard read conditions to group 608-1 can result in the sensing of impedance states and the generation of read output data D1. However, such a sensing operation can take longer than that of group 608-0. Further, unlike the application of fast read conditions, standard read conditions do not disturb the impedance state of elements in group 608-1. Read output data D1 can be provided to I/O path 622, and output from the memory device 600.

Referring to FIG. 6B, a write-back portion of a read/write-back operation is shown. Read data (D0) stored in write back latch 618 can be provided to write circuit 602. Write circuit 620 can write such data (D0) back into memory cell array 602. In the particular embodiment shown, write circuit 620 writes data D0 back into the same group 608-0 from which it was read, as indicated by the notation XX→D0. However, as noted above, in other embodiments, such data (D0) can be written back into a different group, with a logical mapping being changed from the original group 608-0 to the new group.

In some embodiments, a read operation can access more than two groups of elements with different read conditions in an operation that outputs data from all of the groups in a sequential fashion. One such particular embodiment is shown in FIGS. 7A and 7B.

Figure 7A:
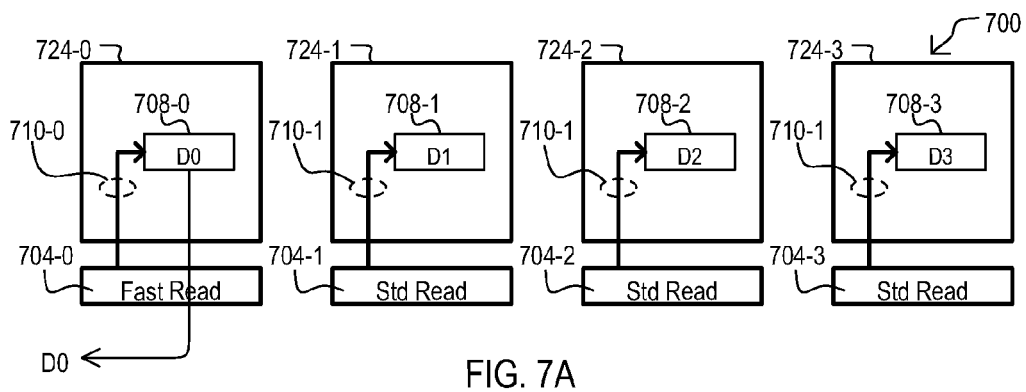
FIGS. 7A and 7B are a sequence of block schematic diagrams showing read operations according to an embodiment.
Figure 7B:
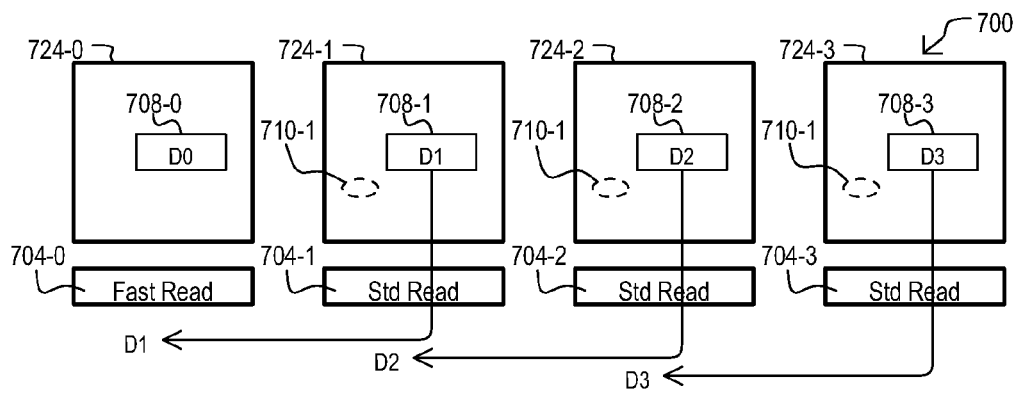

FIGS. 7A and 7B show a memory device 700 that can mix read data generated from fast read conditions with read data from standard read conditions, to increase an overall access speed for all of the read data. FIGS. 7A and 7B show a memory device 700 having four regions 724-0 to -3 of memory cells (referred to hereinafter as "banks", but not intended to imply any particular architecture). Corresponding to each bank (724-0 to -3) can be a condition application circuit 704-0 to -3. It is noted that in some embodiments, each condition application circuit (704-0 to -3) can apply one of multiple read conditions to groups of memory cells within its bank (724-0 to -3). However, in other embodiments, one or all condition application circuit (704-0 to -3) can apply only one read electrical condition, with at least two condition application circuits providing different read conditions.

Referring to FIG. 7A, a first portion of a read operation according to an embodiment is shown. In response to a read request, condition application circuits (704-0 to -3) can apply read conditions to their corresponding banks (724-0 to -3). In the embodiment shown, condition application circuit 704-0 can apply fast read conditions 710-0 to an element group 708-0, while the remaining condition application circuits 704-1 to -3 can apply standard read conditions 710-1 to groups 708-1 to -3, respectively.

Because fast read conditions can sense data value in a shorter amount of time than standard read conditions, read data from group 708-0 (D0) can be available for read data from the other groups (708-1 to -3).

Referring to FIG. 7B, a second portion of a read operation according to an embodiment is shown. As standard read conditions 710-1 continue to be applied to groups 708-1 to -3, read data (D1 to D3) can be generated for such groups, and then output in sequence after read data D0 corresponding to the fast read conditions.

FIGS. 8A to 8E are timing diagrams to illustrate read operations according to various embodiments. Such read operations can be executed by a memory device like that shown in FIGS. 7A and 7B.

FIG. 8A shows a conventional read operation in which standard read conditions are applied to multiple banks. At about time t0, standard read conditions can be applied to banks BANK0 to BANK3.

At time t1, data from BANK0 (D0) can be output as read data. Also at this time, data from the other banks (BANK1 to BANK3) can be ready to be output.

At times t2, t3 and t4, the data (D1, D2, D3) from banks BANK1 to BANK3 can be output one after another, following data D0.

Figure 8B:
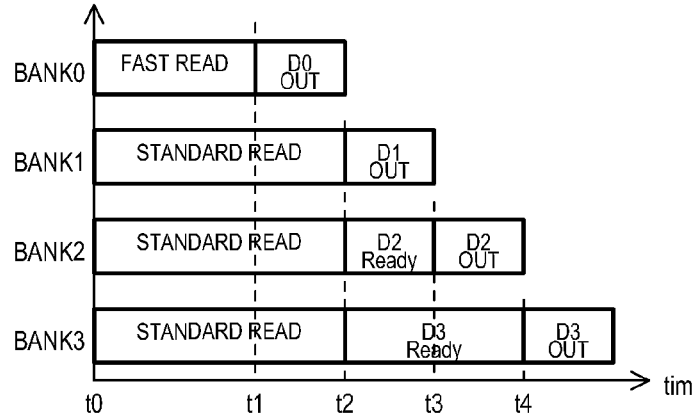

FIG. 8B shows a read operation according to an embodiment.

At about time t0, fast read conditions can be applied to BANK0, while standard read conditions are applied to banks BANK1 to BANK3.

At time t1, data from BANK0 (D0) can be output as read data, faster than is possible by application of standard read conditions. At this time, standard read conditions continue to be applied to the other banks BANK1 to BANK3.

At time t2, data from BANK1 (D1) can be output as read data, in sequence after D0. Also at this time, data (D2, D3) from the remaining banks (BANK2/3) can be ready to be output.

At times t3 and t4, the data from BANK3 and BANK4 can be output one after another.

An overall read operation of data values D0 to D3 can be faster than a conventional read operation, like that of FIG. 8A.

Figure 8C:
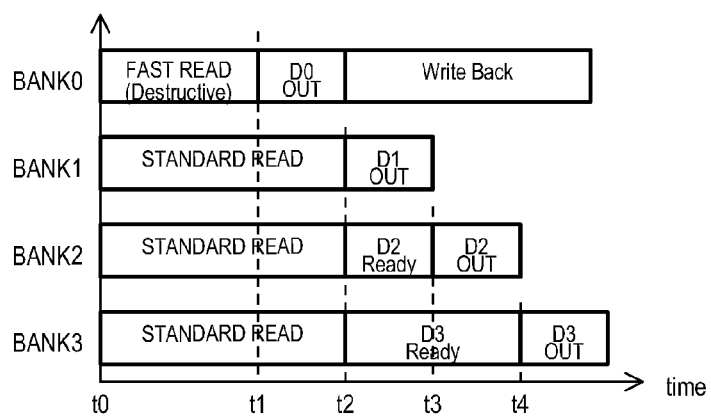

FIG. 8C shows a read operation according to another embodiment. FIG. 8C shows an access operation like that of FIG. 8B. However, in FIG. 8C it is assumed that the application of fast read conditions can be destructive. Consequently, following the output of data D0, the same data can be written back into the memory device starting at time t2, with a write back operation (Write Back).

Figure 8D:
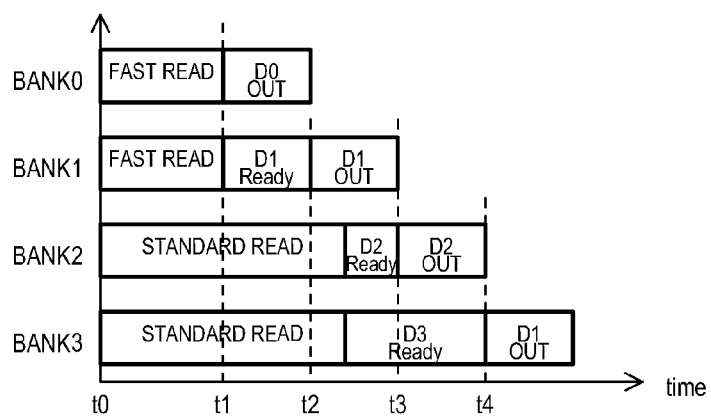

FIG. 8D shows a read operation according to another embodiment. FIG. 8D shows an access operation like that of FIG. 8B. However, in FIG. 8D fast read conditions are applied to more than one bank.

It is noted that FIGS. 8B to 8D show embodiments in which a difference between a fast read time and a standard read time is a data transfer time (i.e., in FIG. 8B the difference between FAST READ and STANDARD READ is equal to D0 OUT).

However, it is understood that in a FAST READ operation data may be available sooner. For example, in FIG. 8B, data D0 can be read prior to time t1.

Figure 8E:
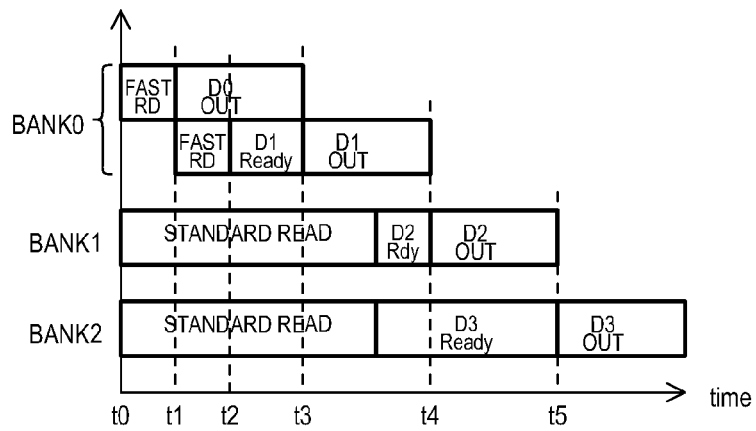

FIG. 8E shows a read operation according to a further embodiment. FIG. 8E shows an access operation in which a fast access time can be a multiple of a standard access time. In the embodiment shown, one bank (BANK0) can be accessed twice to provide two data values (D0, D1) before a data values (D2) is output from a next bank (BANK1).

Figure 8F:
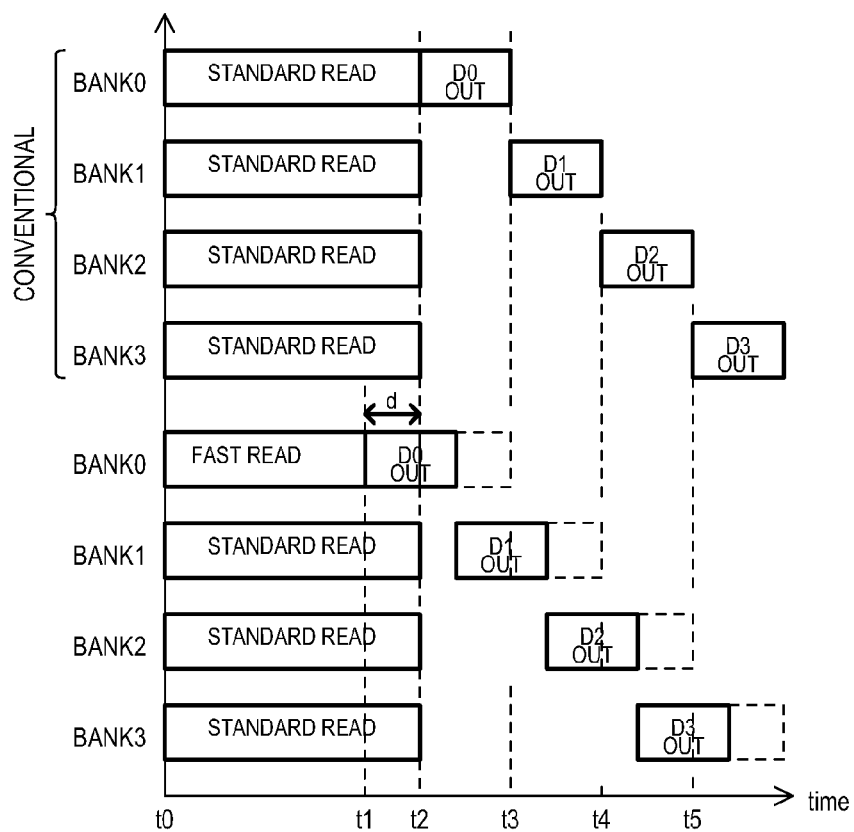

FIG. 8F shows a read operation according to another embodiment. FIG. 8F shows a read operation in which a fast read is longer than a data transfer time. In such an arrangement, that fast read time can allow greater flexibility in data output times than a conventional case.

FIG. 8F includes a conventional operation (CONVENTIONAL), like that of FIG. 8A, to show how data output times are constrained by standard read times. As shown, in a fastest access operation, data values (D0, D1, D2, D3) are output at times t2, t3, t4 and t5.

In contrast, in the read operation according to an embodiment, because a fast read operation is shorter than a standard read operation, a first data (D0) output time can vary from time t1 to a time t2. Possible data output times are shown by dashed lines. Accordingly, including one or more fast read operations can enable more finely tuned data output times than a conventional arrangement.

It is understood that alternate embodiments can include different mixes of fast and standard read conditions. In some embodiments, variations in fast and standard read conditions can be applied to realize energy benefits. Standard read conditions can consume less power than fast read conditions. Thus, standard read conditions can be included in operations to lower power, while maintaining a same latency. For example, lower power read conditions can be hidden within fast read conditions (i.e., not visible to a user of the device) to lower the overall power consumption of a read operation.

It is also understood that in some embodiments, changes in read conditions can vary per access. For example, in one read operation, only fast read conditions can be applied to element groups, but in another read operation, a switch can be made to apply only standard read conditions. Similarly, the type of read operation can vary according to a mode of operation. In a lower power mode of operation, all, or a portion of the condition application circuits can apply the standard read conditions.

In similar fashion to that shown in FIGS. 7A/B, in some embodiments, a write operation can access more than two groups of elements with different write conditions, to establish the impedance states of one or more groups faster than one or more other groups. One such particular embodiment is shown in FIG. 9.

Figure 9:
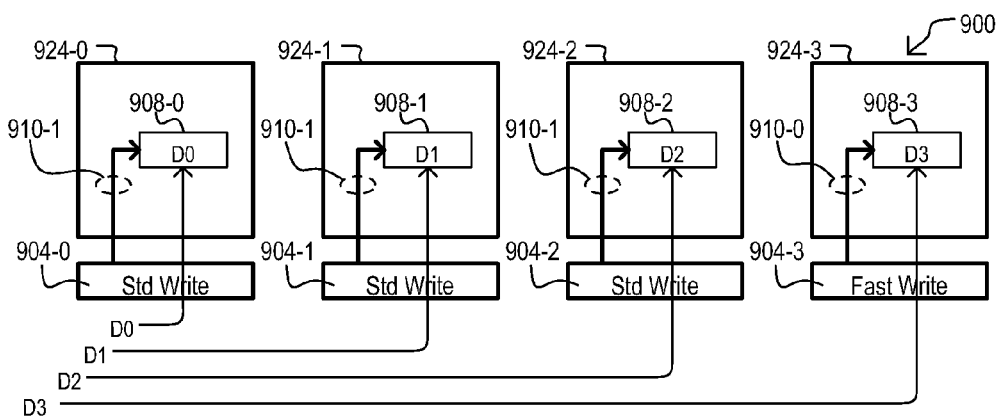
FIG. 9 is a block schematic diagram showing a write operation according to an embodiment.

FIG. 9 shows a memory device 900 that can mix fast write operations with standard write operations, to increase an overall speed for the writing of all data. FIG. 9 shows a memory device 900 like that of FIGS. 7A/B, except that each condition application circuit 904-0 to -3 can apply one of multiple write conditions to groups of memory cells within its bank (924-0 to -3). However, in other embodiments, one or all condition application circuit (904-0 to -3) can apply only one write electrical condition, with at least two condition application circuits providing different write conditions.

It is understood that in some embodiments, different write conditions (e.g., fast and standard) can correspond to electrical conditions applied to establish all impedance states. However, in other embodiments, different write conditions can correspond to less than all possible impedance states. For example, in one embodiment, different write conditions can establish both a low impedance state (e.g., logic 1) and a high impedance state (e.g., logic 0). That is, a memory device can include fast and standard writes for establishing both logic 1's and logic 0's.

However, in alternate embodiments, different write conditions can establish one impedance state, while another impedance state is established with only one write condition. That is, a memory device can include fast and standard writes for establishing a logic 1, but only a standard write for establishing a logic 0's.

Along these same lines, in some embodiments write operations can simultaneously write different logic values. However, in other embodiments, in a write operation, all elements of a group can be written to one logic values in a first step, while selected elements of the group can be written to another logic value based on write data. For example, all elements of a group can be written (e.g., erased) to logic 0. Subsequently, if write data indicates so, element(s) of the group can be written (e.g., programmed) to a logic 1.

It is understood that while the above embodiments describe binary storage elements, other embodiments can include multi-state elements (i.e., elements with more than two impedance state) where any one, or all, impedance states can be established with more than one set of write conditions.

Referring still to FIG. 9, a write operation can include sequentially receiving write data (D0, D1, D2, D3), where each write data value is to be written into a group of elements (908-0 to -3) in different banks 924-0 to -3. In the embodiment shown, data values D0 to D2 can be written into groups 908-0 to -2 with standard write conditions 910-1, while data value D3 can be written into group 908-3 with fast write conditions 910-0.

Because fast write conditions can establish data values in a shorter amount of time than standard write conditions, write data from group 908-3 (D3) can be written into its corresponding group 908-3 faster than data is written into the other groups (908-0 to -2).

FIG. 10A shows a conventional write operation in which standard write conditions are applied to multiple banks. Write data D0 to D3 can be received in a sequential fashion, at times t0 to t3, respectively.

As each write data value is received, standard write conditions can be applied to write the data values into their corresponding bank.

Figure 10B:
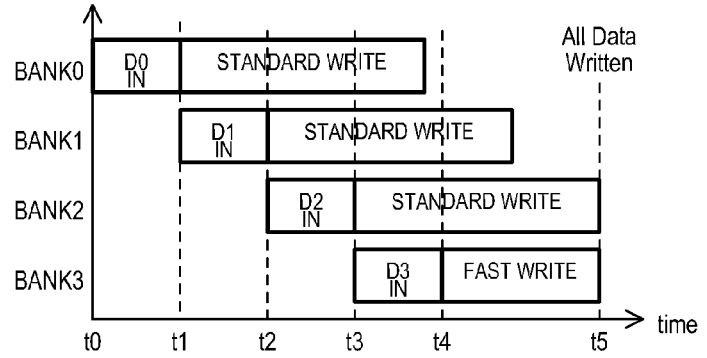

FIG. 10B shows a write operation according to an embodiment.

As in the case of FIG. 10A, At times t0, t1, t2 and t3, write data values D0, D1, D2 and D3 can be received, respectively. Also like FIG. 10A, data values D0, D1 and D2 can be written into their corresponding banks, with standard write conditions at times t1, t2 and t3.

However, unlike FIG. 10A, at time t4, fast write conditions can be applied to write data value D3, enabling such values to be written in a shorter amount of time than the other write data values.

An overall write operation of data values D0 to D3 can be faster than a conventional write operation, like that of FIG. 10A.

Figure 10C:
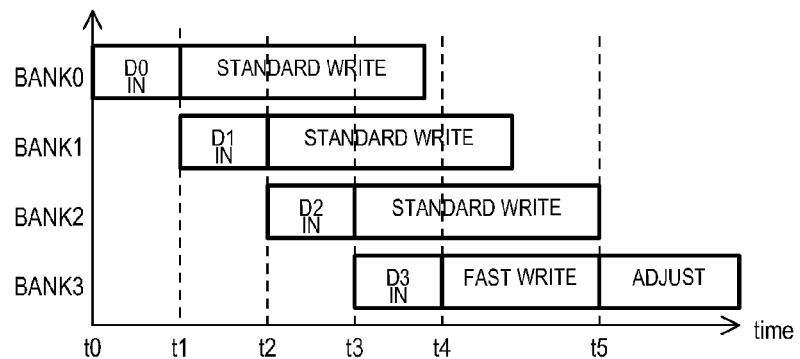

FIG. 10C shows a write operation according to another embodiment. FIG. 10C shows an access operation like that of FIG. 10B, however, in FIG. 10C it is assumed that the application of fast write conditions can result impedance values that may not be in a desired range. Consequently, following the fast write of data value D3, an adjustment operation (ADJUST) can take place that can fine-tune the impedance values of elements storing data value D3.

As in the read operations shown in FIGS. 8A to 8D, alternate embodiments can include different mixes of fast and standard write conditions, as well as variations in write conditions per access and/or per mode.

Figure 12:
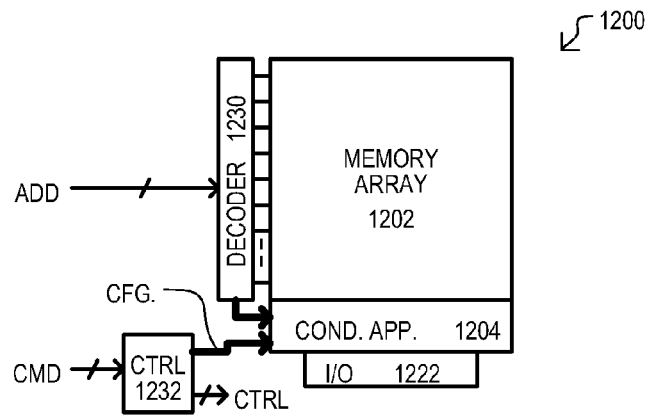
FIG. 12 is a block schematic diagram showing command based dynamic configuration operations that can be included in embodiments.
Figure 13:
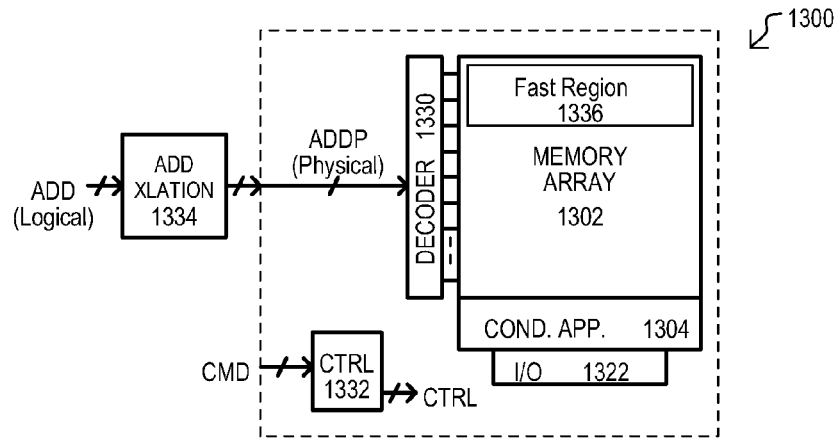
FIG. 13 is a block schematic diagram showing address based dynamic configuration operations that can be included in embodiments.

As noted above, the enabling of different electrical conditions to vary the access speed to memory elements can be established in a static fashion or can be established in a dynamic fashion. A few of many possible ways of establishing the electrical conditions used in data accesses operations, according to embodiments, are shown in FIGS. 11 to 13.

Figure 11:
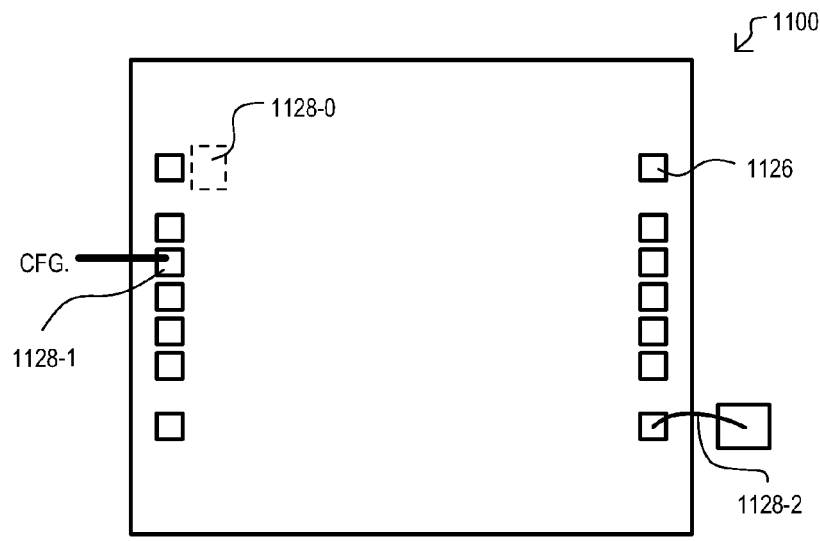
FIG. 11 is a top plan view of a memory device showing static configuration operations that can be included in embodiments.

FIG. 11 is a top plan view of a memory device 1100 in integrated circuit form, showing selected static configuration options, any of which can be included in embodiments to establish how different electrical conditions are applied to memory element groups within the memory device. FIG. 11 shows physical connection points (one shown as 1126), each of which can serve as an input, output (or both) for the memory device 1100. It is understood that condition application circuits, memory elements, and other circuits can be formed in the integrated circuit (but are not shown to avoid cluttering the view).

A first group of possible selection circuits is represented by 1128-0. Selection circuits 1128-0 can include various circuit elements and/or structures of the integrated circuit device for establishing a voltage and/or current level that indicates how different electrical conditions are to be applied to groups of memory elements. Selection circuits 1128-0 can include, but are not limited to: a fabrication option established by an IC manufacturing step (e.g., a metal option); fusible link (i.e., an electrical path that can be opened or remain intact via laser, overcurrent, or other method); antifuse elements; or nonvolatile memory cells.

Another possible selection circuit is represented by 1128-1. Selection circuits 1128-1 can be a physical input to device 1100 configured to receive an input signal CFG. According to such a signal (or multiples of such signals), different electrical conditions can be selected for application to memory element groups.

Another possible selection circuit is represented by 1128-2. Selection circuits 1128-2 can be an IC packaging option, such as a bond option. In such a configuration, an input to memory device 1100 can be connected to one of multiple power supply voltage connections of an IC package containing the IC device 1100.

It is understood that any of the selection circuits (1128-0 to -2) can be repeated multiple times to enable or disable electrical conditions for particular sections of a memory device (e.g., per bank, etc.).

FIG. 12 is a block schematic diagram of a memory device 1200, showing a dynamic configuration option that can be included in embodiments to establish how different electrical conditions are applied to memory element groups within the memory device. In particular, FIG. 12 shows the selection of electrical conditions in response to command information.

A memory device 1200 can include a memory cell array 1202, condition application circuits 1204, and I/O path 1222. These sections can take the form of any of those shown herein, or equivalents.

In addition, a memory device 1200 can include a decoder circuit 1230 and a control circuit 1232. A decoder circuit 1230 can decode address values (ADD) to select groups in an access operation. In the embodiment shown, a control circuit 1232 can receive command data CMD, and in response, generate configuration data CFG that can enable or disable electrical conditions applied to elements in an access operation.

Thus, in very particular embodiments, fast read and/or fast write operations can be established via command signals input to a memory device.

FIG. 13 is a block schematic diagram of a memory device 1300, showing another dynamic configuration option that can be included in embodiments. In particular, FIG. 13 shows the selection of electrical conditions in response to address values.

A memory device 1300 can include sections like those of FIG. 12, but in addition, can include an address translation circuit 1334. An address translation circuit 1334 can receive logical address values (ADD) and translate them into physical address values (ADDP).

A memory cell array 1302 can include one or more regions (one shown as "fast region" 1336) that receive different electrical conditions in an access operation than other regions.

Embodiments of the invention can vary to the electrical conditions applied to different memory element groups in an access operation control a speed and/or amount of energy consumed by a memory device. In particular embodiments, energy consumption benefits can arise, as lower power conditions can be mixed with higher power conditions, but hidden due to the inherent latency of the access operation.

While embodiments can include various memory element types as noted above, in a very particular embodiment, a memory device can be a CBRAM type device that applies a read voltage of about 0.2 volts to CBRAM memory elements as one read condition (e.g., a standard read), and that applies about 1.0 volts to memory elements as another read condition (e.g., a fast read).

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a plurality of memory elements programmable between different impedance states; and
circuits configured to apply first electrical conditions to one group of memory elements in an access operation and second electrical conditions, different from the first electrical conditions, to another or the same group of memory elements in the access operation, to vary access speeds to the groups of memory elements in the access operation; wherein
the memory elements comprise a programmable resistance material formed between two electrodes.

2. The memory device of claim 1, wherein:
the memory elements each comprise a solid state electrolyte in which conductive elements are formed and dissolved.

3. The memory device of claim 1, wherein:
the difference between the first electrical conditions and the second electrical conditions is selected from: a difference in voltage magnitude, a difference in electrical pulse duration, a difference in maximum current, a difference in waveform shape, and a difference in pulse density.

4. The memory device of claim 1, wherein
the circuits comprise
a fast circuit that applies the first electrical conditions for accesses to a group of memory elements at a first speed, and
a standard circuit that applies the second electrical conditions for accesses to a group of memory elements at a second speed, slower than the first speed.

5. The memory device of claim 4, wherein:
the fast circuit accesses a first portion of the memory elements and does not access a second portion of the memory elements.

6. The memory device of claim 4, wherein:
the circuits further include a multiplexer (MUX) that selectively connects the fast circuit and standard circuit to groups of memory elements.

7. The memory device of claim 1, wherein:
the circuits include
at least one fast write circuit configured to apply first electrical conditions to write data into one group of memory elements within a first time period, and
standard write circuits configured to apply second electrical conditions to write data into the same or another group of memory elements within a second time period that is longer than the first time period.

8. The memory device of claim 7, further including:
access circuits configured to receive write data for one group in sequence with write data from at least one the other groups; and
the fast write circuit is configured to start applying the first electrical conditions to the one group upon receiving write data for the one group; and
the standard write circuits are configured to start applying the second electrical conditions to another group upon receiving write data for one of the other groups.

9. The memory device of claim 7, further including:
a write adjust store configured to store data write data for the fast write circuit; and
a write adjust circuit configured to apply third electrical conditions to the one group of memory elements after the fast write circuits has applied the first electrical conditions to the one group.

10. The memory device of claim 1, further including:
a selection circuit configured to enable or disable the application of the first electrical conditions to the one group of elements in response to a selection value; wherein
the selection value is selected from: a static value that is constant during the operation of the memory device and a dynamic value that changes during the operation of the memory device.

11. The memory device of claim 10, wherein:
the selection circuit is selected from: a physical integrated circuit (IC) input configured to receive an input signal as the configuration value; an integrated circuit packaging option; at least one metal option to establish a conductive path in an IC fabrication step; at least one fusible link; at least one anti-fuse structure; at least one non-volatile memory cell; a command decoder circuit; and address decoder circuit.

12. A memory device, comprising:

a plurality of memory elements programmable between different impedance states; and circuits configured to apply first electrical conditions to one group of memory elements and second electrical conditions, different from the first electrical conditions, to another group of memory elements to vary access speeds to the different groups of memory elements; wherein the circuits include at least one fast read circuit configured to apply first electrical conditions to sense impedance states of one group of memory elements within a first time period, and standard read circuits configured to apply second electrical conditions to sense impedance states of the same or another group of memory elements within a second time period that is longer than the first time period.

13. The memory device of claim 12, further including:

the fast read circuit is configured to start applying the first electrical conditions at the same time the standard read circuits apply the second electrical conditions; and access circuits configured to output read data from the one group in sequence with read data from at least one of the other groups.

14. The memory device of claim 12, further including:

a write back store configured to store data from the fast read circuit; and a write circuit configured to write data stored in the write back store back into a group of memory elements.

15. A method, comprising:

in response to an operation that accesses groups of memory elements of a memory device, applying first electrical conditions to one group of memory elements, and applying second electrical conditions, different from the first electrical conditions, the same or another group of memory elements to vary a speed of access between the groups; wherein the memory elements are programmable between at least two different impedance states; wherein the operation comprises a read operation.

16. The method of claim 15, wherein:

the first electrical conditions differ from the second electrical conditions in a manner selected from: a difference in voltage magnitude, a difference in electrical pulse duration, a difference in maximum current, a difference in waveform shape, and a difference in pulse density.

17. The method of claim 15, wherein:

the first electrical conditions determine the impedance states of the one group within a first time period to generate first read data, and the second electrical conditions determine the impedance states of the same or other group within a second time period to generate second read data; wherein the second time period is longer than the first time period.

18. The method of claim 17, wherein:

the first electrical conditions are applied to the one group at the same time the second electrical conditions are applied to another group, and the first read data is output before second read data.

19. The method of claim 17, further including:

storing the first read data; and re-writing the first read data back into a group of memory elements after applying the first electrical conditions.

20. The method of claim 15, further including:

in response to a write operation, applying first write electrical conditions to establish impedance states of one group within a first write time period, and applying second write electrical conditions to establish impedance states of the one or another other group within a second write time period; wherein the second write time period is longer than the first write time period.

21. The method of claim 15, further including:

selecting the one group from other groups of memory elements based on: an address value, command inputs, a value stored in a nonvolatile storage element, a physical configuration of an integrated circuit package, a fabrication option of an integrated circuit device.

22. The method of claim 15, wherein:

the memory elements comprise a programmable resistance material formed between two electrodes.

* * * * *